(12) United States Patent
Bosch et al.

(10) Patent No.: US 10,008,363 B2
(45) Date of Patent: Jun. 26, 2018

(54) METHOD OF IMAGING A SPECIMEN USING PTYCHOGRAPHY

(71) Applicant: FEI Company, Hillsboro, OR (US)

(72) Inventors: Eric Gerardus Theodoor Bosch, Eindhoven (NL); Bart Jozef Janssen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days. days.

(21) Appl. No.: 15/648,757

(22) Filed: Jul. 13, 2017

(65) Prior Publication Data

US 2018/0019098 A1 Jan. 18, 2018

(30) Foreign Application Priority Data

Jul. 13, 2016 (EP) .................................. 16179172

(51) Int. Cl.
*H01J 37/22* (2006.01)
*H01J 37/20* (2006.01)
*H01J 37/244* (2006.01)
*H01J 37/28* (2006.01)

(52) U.S. Cl.
CPC ............ *H01J 37/222* (2013.01); *H01J 37/20* (2013.01); *H01J 37/228* (2013.01); *H01J 37/244* (2013.01); *H01J 37/28* (2013.01); *H01J 2237/226* (2013.01); *H01J 2237/2614* (2013.01)

(58) Field of Classification Search
CPC ........ H01J 37/222; H01J 37/20; H01J 37/228; H01J 37/244; H01J 37/28; H01J 2237/226; H01J 2237/2614
See application file for complete search history.

(56) References Cited

U.S. PATENT DOCUMENTS

| 9,202,670 B2 | 12/2015 | Janssen et al. |
| 2015/0170876 A1* | 6/2015 | Janssen ............... H01J 37/28 250/307 |

OTHER PUBLICATIONS

Hue et al, "Extended Ptychography in the Transmission Electron Microscope: Possibilities and Limitations", Ultramicroscopy, 111:1117-1123.*
Humphry et al, "Ptychographic Electron Microscopy Using High-Angle Dark-Field Scattering for Sub-Nanometre Resolution Imaging", Nature Communications 3(730), 2012.*
Rodenberg et al, "A Phase Retrieval Algorithm for Shifting Illumination", Applied Physics Letters, 85 (20), 2004.*

(Continued)

*Primary Examiner* — David E Smith
(74) *Attorney, Agent, or Firm* — Klarquist Sparkman, LLP

(57) ABSTRACT

A method of imaging a specimen using ptychography includes directing a charged-particle beam from a source through an illuminator so as to traverse the specimen and land upon a detector, detecting a flux of radiation emanating from the specimen with the detector, calculating at least one property of a charged-particle wavefront exiting the specimen based on using an output of the detector in combination with applying a mathematical reconstruction technique, wherein the at least one property comprises a phase of the wavefront, and wherein applying the mathematical construction technique comprises directly reconstructing the phase of the wavefront to determine a reconstructed phase of the wavefront. An associated apparatus is also described.

20 Claims, 2 Drawing Sheets

(56) References Cited

OTHER PUBLICATIONS

Escovitz et al., Scanning Transmission Ion Microscope with a Field Iron Source, *Proc. Nat. Aced. Sci. USA*, 72(5):1826-1828 (May 1975).
Extended European Search Report received from the European Patent Office for European Patent Application No. 17174986.4, dated Dec. 14, 2017.
Hesse et al., "Proximal Heterogeneous Block Implicit-Explicit Method and Application to Blind Ptychographic Diffraction Imaging," *SIAM J. Imaging Sciences*, 8(1):426-457 (2015).
Maiden et al., "An improved ptychographical phase retrieval algorithm for diffractive imaging," *Ultramicroscopy*, 109(10):1256-1262 (Sep. 2009).
Thibault et al., "Probe retrieval in ptychographic coherent diffractive imaging," *Ultramicroscopy*, 109(4):338-343 (Mar. 2009).
European Search Report for related European Application No. EP 16 17 9172, 6 pages, dated Jan. 30, 2017.
Hüe et al., "Extended ptychography in the transmission electron microscope: Possibilities and limitations," *Ultramicroscopy*, 111:1117-1123 (Feb. 2011).
Humphry et al., "Ptychographic electron microscopy using high-angle dark-field scattering for sub-nanometre resolution imaging," *Nature Communications*, 3(730), 7 pages (Mar. 2012).
Rodenburg et al., "A phase retrieval algorithm for shifting illumination," *Applied Physics Letters*, 85(20):4795-4797 (Nov. 15, 2004).

\* cited by examiner

METHOD OF IMAGING A SPECIMEN USING PTYCHOGRAPHY

CROSS REFERENCE TO RELATED APPLICATION

The present application claims priority from pending European Patent Application No. 16179172.8, filed Jul. 13, 2016, which is incorporated herein by reference.

BACKGROUND

The invention relates to a method of imaging a specimen using ptychography, whereby a charged-particle beam is directed from a source through an illuminator so as to traverse the specimen and land upon a detector, an output of the detector being used in combination with a mathematical reconstruction technique so as to calculate at least one property of a charged-particle wavefront exiting the specimen.

The invention additionally relates to an apparatus for performing such a method.

The invention further relates to a charged-particle microscope in which such a method can be enacted and/or in which such an apparatus can be comprised.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (eg. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
http://en.wikipedia.org/wiki/Electron_microscope
http://en.wikipedia.orgiwiki/Scanning_electron_microscope
http://en.wikipedia.org/wiki/Transmission_electron_microscopy
http://en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
https://en.wikipedia.org/wiki/Focused_ion_beam
http://en.wikipedia.org/wiki/Scanning_Helium_Ion_Microscope
W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).
http://www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:

- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), a CPM will specifically comprise:

- An imaging system, which essentially takes charged particles that are transmitted through a specimen (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

A method as set forth in the opening paragraph above is, for example, elucidated in an article by M. J. Humphry et al.

in Nature Communications, 3:730, DOI 10:1038/ncomms1733, Macmillan Publishers Limited (2011), see:
http://www.nature.com/ncomms/journal/v3/n3/full/ncomms1733.html This article discusses electron beam ptychography, and its application to conduct a form of "lens-less microscopy" in a SEM. The approach disclosed in the article can be regarded as a modification of related techniques from the field of X-ray imaging, where lens-less techniques are attractive because of the difficulty in producing satisfactory X-ray optical systems. In the article, an illuminator produces a convergent electron beam that is focused onto and through a specimen (in a specimen plane) so as to impinge upon a CCD detector. The convergent electron beam is referred to as a "probe", and this probe is scanned across the specimen in a series of measurement sessions. In each such session, an associated diffraction pattern is recorded by the CCD, and these various patterns are used as input to an iterative mathematical inverse problem solving technique in an attempt to reconstruct the amplitude/phase of the electron-beam wavefront exiting the specimen (somewhat analogous to a deconvolution technique). This, in turn, provides information on the structure of the employed specimen. For more information on this approach, see, for example, the article by J. M. Rodenburg and H. M. L. Faulkner in Appl. Phys. Lett. 85, pp. 4795-4798 (2004) [see the following link]:
http://scitation.aip.org/content/aip/journal/apl/85/20/10.1063/1.1823034

Some general information on ptychography can be gleaned from the following Wikipedia link:
https://en.wikipedia.org/wiki/Ptychography And an example of a specific ptychographic method/apparatus is set forth in U.S. Pat. No. 9,202,670 (with the same assignee as the present patent application), which is incorporated herein by reference.

For good order, it is pointed out that what is effectively being reconstructed in such ptychography techniques is a change in a (planar) wavefront as it traverses the specimen. Although ptychography techniques use a relative narrow beam that only illuminates a localized area of the specimen (and that is moved to a series of different locations on the specimen in a corresponding series of measurement sessions), the reconstruction effectively calculates changes to a (virtual) broad wavefront that traverses the full area of the specimen in one go. This point will be fully grasped by the skilled artisan.

A problem with current ptychographic techniques is that they are subject to so-called "phase wrapping" (also called "phase vortexing")—which can be particularly problematic for specimens that are relatively thick and/or comprise material with a relatively high atomic number. This phenomenon has to do with the fact that conventional wavefront reconstruction techniques intrinsically limit the reconstructed wavefront phase to a truncated range $[0, 2\pi]$ (or, equivalently, $[-\pi, +\pi]$); in reality, however, the actual phase can have a value outside this range, in which case the phase will have to be "wrapped up" in order to fit within the truncated range. When the reconstructed phase is used to produce an image of the specimen, such "phase wrapping" can cause distortion of the image (see, for example, FIG. 2A); in order to (attempt to) restore such a distorted image, a "phase unwrapping" algorithm must be applied.

SUMMARY

It is an object of the invention to provide an alternative to known ptychographic techniques. In particular, it is an object of the invention that said alternative should mitigate the abovementioned phase wrapping issue.

These and other objects are achieved in a method as set forth in the opening paragraph above, which method is characterized in that:
Said property is a phase of the wavefront;
Said mathematical reconstruction technique directly reconstructs said phase, rather than deriving it indirectly from a reconstructed function of amplitude and phase.

In line with comments already made above, the term "phase" as referred to here is intended to encompass a phase change to the wavefront.

BRIEF DESCRIPTION OF DRAWINGS

The invention will now be elucidated in more detail on the basis of exemplary embodiments and the accompanying schematic drawings, in which.

In the Figures, where pertinent, corresponding parts are indicated using corresponding reference symbols. It should be noted that, in general, the Figures are not to scale.

DETAILED DESCRIPTION

Figure 1:
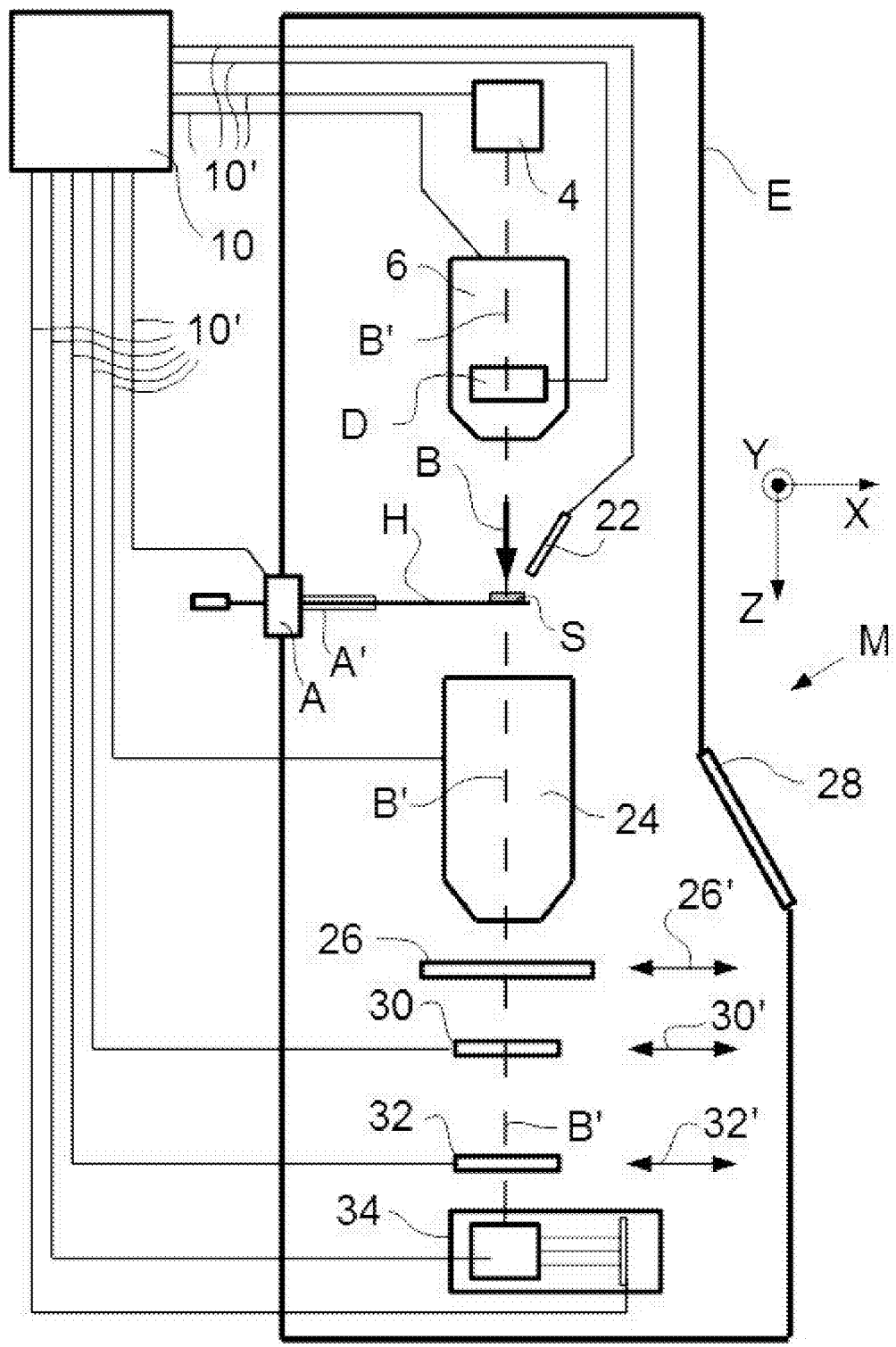
FIG. 1 is a longitudinal cross-sectional view of a CPM, depicted schematically, in which an embodiment of the current invention can be carried out.

In traditional mathematical reconstruction techniques used in ptychography (such as the so-called "Rodenburg scheme" [see above]), one attempts to reconstruct a so-called "transmission function" (T), which is a functional expression of wavefront amplitude (A) and phase ($\varphi$) at a (vector) point $\vec{r}$ in (or just after) the specimen plane, and typically takes a form such as:

$$T(\vec{r}) = A(\vec{r})e^{i\varphi(\vec{r})}$$

For large $\varphi$, a series of expansion of the term $e^{i\varphi(\vec{r})}$ will include higher powers of $\varphi$ (higher harmonics), thereby distributing power to high spatial frequencies. Consequently, if one would like to limit the reconstructed entity to a given resolution, it will not be possible to successfully filter the transmission function itself—instead, one will need to be able to directly filter the phase. However, with phase jumps present—due to the aforementioned problem of phase wrapping—this cannot be done. The present invention solves this dilemma by directly reconstructing $\varphi$ rather than indirectly deriving it from a reconstructed transmission function. Apart from addressing the issues described above, this has the additional advantage that, for a relatively thin specimen, $\varphi$ is proportional to electrical potential, so that the reconstructed entity has direct physical meaning.

A more mathematical elucidation of the invention can be given as follows. The invention is applicable to any ptychographic scheme that involves iteration over an object, which, in the case of charged particle microscopy, takes the form of a transmission function $T(r)$. This transmission function is, in general, a complex-valued function of (vector) position $r$, and can be written as:

$$T(r) = A(r)e^{i\varphi(r)} \quad (1)$$

where $A(r)$ is an amplitude and $\varphi(r)$ is the phase. Both $A(r)$ and $\varphi(r)$ are real-valued functions and, without loss of generality, one can require $A(r) > 0$.

For a pure phase object, the amplitude can be neglected. Note that, for typical samples that are used in (S)TEM imaging, the amplitude is close to one for all positions, as most of the electron beam is transmitted through the typically thin samples. In general, it is possible to absorb the amplitude into the imaginary part of φ(r). Therefore, one can re-write the transmission function as:

$$T(r) = e^{i\varphi(r)} \quad (2)$$

where φ(r) is now understood to be a complex-valued function representing the object. Any iterative Ptychographic reconstruction scheme has the characteristic that it takes an estimate, $T_n(r)$, of the transmission function at the current iteration index, n, and updates it with some correction $\Delta_n(r)$:

$$T_{n+1}(r) = T_n(r) + \alpha_n \Delta_n(r) \quad (3)$$

which includes a parameter $\alpha_n$ that controls the (rate of) convergence of the scheme. The subscript n indicates the iteration index and the scheme is initialized with some appropriate guess for $T_0(r)$.

One can now rewrite (3) using (2) as:

$$e^{i\varphi_{n+1}(r)} = e^{i\varphi_n(r)} + \alpha_n \Delta_n(r), \quad (4)$$

where $\varphi_n(r)$ is the estimate for φ(r) at iteration index n.
Equation (4) can also be re-written as:

$$e^{i(\varphi_{n+1}(r) - \varphi_n(r))} = 1 + e^{-i\varphi_n(r)} \alpha_n \Delta_n(r). \quad (5)$$

The insight at the heart of the present invention is that, physically, one is interested in φ and not in T. It is possible to add (integer multiples of) 2π to the real part of φ (the phase of the transmission function) and obtain the same transmission function from a mathematical point of view. This can even be done at random for any position r and nothing changes. Therefore, mathematically, the phase is usually limited to a range of extent 2π (e.g. [−π,π] or [0, 2π]). This, however, does not make sense physically, as this real part of φ represents the projected potential inside the sample, which is a continuous function that can have any real value.

The present invention iterates over the logarithm of (5), assuming that:
(a) The function T is nowhere zero (which in Ptychography would correspond to either a measurement where one completely blocked the beam, or measuring no signal at all due to detector limitations), and;
(b) The norm of the correction term $\alpha_n \Delta_n$ is small (at least smaller than 1), which can be arranged by a proper choice of $\alpha_n$.

The result of taking the natural logarithm of (5) and approximating it with the lowest term in its series expansion around 1 is:

$$i(\varphi_{n+1}(r) - \varphi_n(r)) = \ln(1 + e^{-i\varphi_n(r)} \alpha_n \Delta_n(r)) \approx e^{-i\varphi_n(r)} \alpha_n \Delta_n(r) \quad (6)$$

which can be rearranged as:

$$\varphi_{n+1}(r) = \varphi_n(r) - i e^{-i\varphi_n(r)} \alpha_n \Delta_n(r). \quad (7)$$

One important aspect of the described approach is to replace the iteration step (3) with (7), thereby keeping track of the function φ(r). This ensures continuity of (i.e. prevents phase jumps from building up in) the estimate of φ(r) (assuming that both the correction terms and the initial guess are continuous) and allows spatial filtering of the physical object instead of the mathematical object which is the transmission function.

This procedure can be applied to a whole class of Ptychographic reconstruction schemes as will be demonstrated below. This can be done even in the case where, in the formulation of the algorithm, there is no specific reference to an iteration scheme as in (3).

A specific embodiment of the invention modifies the so-called Rodenburg scheme, e.g. as originally presented in the journal article by A. M. Maiden & J. M. Rodenburg, *An improved ptychographical phase retrieval algorithm for diffractive imaging*, Ultramicroscopy, 109 (2009), pp. 1256-1262. In this scheme, there are two main steps: the first one is iteration over estimates of the probe $P_n(r)$ (which is another complex-valued function of position), and the second one is iteration over estimates of the object (transmission function). As a starting point, one uses two parameters, α>2 and β>2, and an initial guess of the probe, $P_0(r)$, and of the object, $T_0(r)$. Furthermore, one assumes a set of m measurements $M_j(k)$ (taken in the diffraction plane with coordinate k) at probe positions $r_p^j$ for j=0 . . . m. For each probe position, an exit wave, $\psi_0(r, r_p^j)$, which is consistent with the measurements, is defined. This set of exit waves can, for example, be constructed according to equation (12) below, using the initial guesses for the probe and the object. Other choices are also allowed.

The iteration step for the probe is given by the following update step:

$$P_{n+1}(r) \leftarrow P_n(r) - \frac{2}{\alpha_n} \sum_{j=1}^{m} \overline{T_n(r + r_p^j)} (T_n(r + r_p^j) \cdot P_n(r) - \psi_n(r, r_p^j)), \quad (8)$$

where $$\alpha_n = \alpha \left\| \sum_{j=1}^{m} \overline{T_n(r + r_p^j)} \cdot T_n(r + r_p^j) \right\|_{\infty} \quad (9)$$

With $\|X\|_\infty$ denoting the maximum value of the argument X, and the horizontal bar denoting complex conjugation.

For the object (transmission function) the iteration step is:

$$T_{n+1}(r) \leftarrow T_n(r) - \frac{2}{\beta_n} \sum_{j=1}^{m} \overline{P_n(r - r_p^j)} (T_n(r) \cdot P_n(r - r_p^j) - \psi_n(r - r_p^j, r_p^j)), \quad (10)$$

where $$\beta_n = \beta \left\| \sum_{j=1}^{m} \overline{P_n(r - r_p^j)} \cdot P_n(r + r_p^j) \right\|_{\infty}. \quad (11)$$

Using the updated probe and object, one can form a new estimate of the output wave for each probe position that satisfies the set of measurements as:

$$\psi_{n+1}(r, r_p^j) \leftarrow \mathcal{F}^{-1} \left\{ \frac{\sqrt{M_j(k)} \cdot \mathcal{F}\{P_{n+1}(r' - r_p^j) \cdot T_{n+1}(r')\}(k)}{|\mathcal{F}\{P_{n+1}(r' - r_p^j) \cdot T_{n+1}(r')\}(k)|} \right\}(r). \quad (12)$$

Here, $\mathcal{F}\{\ \}$ and $\mathcal{F}^{-1}\{\ \}$ denote a 2D Fourier transform and its inverse, respectively. The forward transform is over the dummy variable r' in both cases, and the inverse transform is over the dummy variable k.

Iteration proceeds until some stopping criterion is fulfilled.

The modification according to the present invention is applied in (10), resulting in:

$$\varphi_{n+1}(r) \leftarrow \qquad (13)$$

$$\varphi_n(r) + \varepsilon e^{-i\varphi_n(r)} \frac{2}{\beta_n} \sum_{j=1}^{m} \overline{P_n(r - r_p^j)} (T_n(r) \cdot P_n(r - r_p^j) - \psi_n(r - r_p^j, r_p^j))$$

with $\varepsilon$ a parameter that is used to keep the changes in $\varphi$ small so that (6) holds. The updated $\varphi$ is subsequently used to form the updated T which is needed in the rest of the scheme, i.e. $T_n(r) = e^{i\varphi_n(r)}$.

Another embodiment of the present invention modifies the so-called PheBIE scheme, e.g. as originally presented in the journal article by R. Hesse, D. R. Luke, S. Sabach & M. K. Tam, *Proximal Heterogeneous Block Implicit-Explicit Method and Application to Blind Ptychographic Diffraction Imaging*, SIAM J. Imaging Sciences 8(1) (2015), pp. 426-457.

In the PHeBIE scheme, essentially the same steps are needed as in the Rodenburg scheme elucidated above, albeit with some adaptations in the coefficients and with a different ordering of the update steps.

As a starting point, one has two real-valued functions, $\alpha(r) > 1$ and $\beta(r) > 1$, a parameter $\gamma > 0$, an initial guess of the probe, $P_0(r)$, and of the object, $T_0(r)$, and a set of m measurements $M_j(k)$ at probe positions $r_p^j$ for $j = 0 \ldots m$. For each probe position, an exit wave, $\psi_0(r, r_p^j)$, that is consistent with the measurements is defined. This set of exit waves can, for example, be constructed according to equation (12) above, using the initial guesses for the probe and the object. Other choices are also allowed.

The iteration step over the probe is given by:

$$P_{n+1}(r) \leftarrow P_n(r) - \frac{2}{\alpha_n(r)} \sum_{j=1}^{m} \overline{T_n(r + r_p^j)} (T_n(r + r_p^j) \cdot P_n(r) - \psi_n(r, r_p^j)), \qquad (14)$$

where $$\alpha_n = \alpha(r) \sum_{j=1}^{m} \overline{T_n(r + r_p^j)} \cdot T_n(r + r_p^j). \qquad (15)$$

For the object (transmission function) one has:

$$T_{n+1}(r) \leftarrow \qquad (16)$$

$$T_n(r) - \frac{2}{\beta_n(r)} \sum_{j=1}^{m} \overline{P_{n+1}(r - r_p^j)} (P_{n+1}(r - r_p^j) \cdot T_n(r) - \psi_n(r - r_p^j, r_p^j)),$$

which now immediately uses the updated probe (14) and where $$\beta_n(r) = \beta(r) \sum_{j=1}^{m} \overline{P_{n+1}(r - r_p^j)} \cdot P_{n+1}(r - r_p^j). \qquad (17)$$

Note that, compared to the Rodenburg scheme, the coefficients $\alpha_n$ and $\beta_n$ have now become real-valued functions of position instead of constants. Furthermore, in (16), the updated probe is used instead of the previous estimate of the probe.

Using the updated probe and object, a new estimate of the output wave for each probe position is formed using the set of measurements as:

$$\psi_{n+1}(r, r_p^j) \leftarrow \mathcal{F}^{-1} \left\{ \frac{\sqrt{M_j(k)} \cdot \mathcal{F}\left\{ \frac{2}{2+\gamma} P_{n+1}(r' - r_p^j) \cdot T_{n+1}(r') + \frac{\gamma}{2+\gamma} \psi_n(r', r_p^j) \right\}(k)}{\left| \mathcal{F}\left\{ \frac{2}{2+\gamma} P_{n+1}(r' - r_p^j) \cdot T_{n+1}(r') + \frac{\gamma}{2+\gamma} \psi_n(r', r_p^j) \right\}(k) \right|} \right\}(r). \qquad (18)$$

The parameter $\gamma$ is used to influence the convergence of the scheme. Iteration proceeds until a stopping criterion is fulfilled.

The modification according to the present invention is applied in (16), resulting in:

$$\varphi_{n+1}(r) \leftarrow \varphi_n(r) + \varepsilon e^{-i\varphi_n(r)} \frac{2}{\beta_n(r)} \qquad (19)$$

$$\sum_{j=1}^{m} \overline{P_{n+1}(r - r_p^j)} (P_{n+1}(r - r_p^j) \cdot T_n(r) - \psi_n(r - r_p^j, r_p^j)),$$

with $\varepsilon$ a parameter that is used to keep the changes in $\varphi$ small so that (6) holds. The updated $\varphi$ is subsequently used to form the updated T, which is needed in the rest of the scheme, i.e. $T_n(r) = e^{i\varphi_n(r)}$.

Yet another embodiment of the present invention modifies the so-called Thibault scheme, e.g. as originally presented in the journal article by P. Thibault, M. Dierolf, O. Bunk, A. Menzel & F. Pfeiffer, *Probe retrieval in ptychographic coherent diffractive imaging*, Ultramicroscopy, 109 (2009), pp. 338-343. The Thibault algorithm uses two nested iteration loops, whereby the outer iteration loop uses the outcome of the inner iteration loop to update the output waves at each probe position.

As a starting point, one has an initial guess of the probe $P_0(r)$ and of the object $T_0(r)$, and a set of m measurements $M_j(k)$ at probe positions $r_p^j$ for $j = 0 \ldots m$. For each probe position, an exit wave $\psi_0(r, r_p^j)$, which is consistent with the measurements, is defined. This set of exit waves can, for example, be constructed according to equation (12) above, using the initial guesses for the probe and the object. Other choices are also allowed.

The inner iteration loop does a number $\Lambda$ of iterations (indicated with the superscript l) on the probe, initialized with $P_n^0(r) = P_n(r)$, and the object, initialized with $T_n^0(r) = T_n(r)$, as given by:

$$P_n^{l+1}(r) \leftarrow \frac{1}{\alpha^l(r)} \sum_{j=1}^{m} \overline{T_n^l(r + r_p^j)} \cdot \psi_n(r, r_p^j) \qquad (20)$$

and $$T_n^{l+1}(r) \leftarrow \frac{1}{\beta^l(r)} \sum_{j=1}^{m} \overline{P_n^l(r - r_p^j)} \cdot \psi_n(r - r_p^j, r_p^j) \qquad (21)$$

-continued where $$\alpha^l(r) = 2\sum_{j=1}^{m} \overline{T_n^l(r+r_p^j)} \cdot T_n^l(r+r_p^j) \quad (22)$$

and $$\beta^l(r) = 2\sum_{j=1}^{m} \overline{P_n^l(r-r_p^j)} \cdot P_n^l(r+r_p^j). \quad (23)$$

Note that (22) and (23) resemble (15) and (17), respectively, with $\alpha(r)=\beta(r)=2$.

At the end of this set of iterations, the results are an updated probe and object given by $P_{n+1}(r)=P_n^{A+1}(r)$ and $T_{n+1}(r)=T_n^{A+1}(r)$, respectively. These are then used in the outer iteration loop to form the following updates for each probe position:

$$\psi_{n+1}(r, r_p^j) \leftarrow \psi_n(r, r_p^j) + \quad (24)$$

$$\mathcal{F}^{-1}\left\{\frac{\sqrt{M_j(k)} \cdot \mathcal{F}\{2P_{n+1}(r'-r_p^j) \cdot T_{n+1}(r') - \psi_n(r, r_p^j)\}(k)}{|\mathcal{F}\{2P_{n+1}(r'-r_p^j) \cdot T_{n+1}(r') - \psi_n(r, r_p^j)\}(k)|}\right\}(r) -$$

$$P_{n+1} \cdot T_{n+1}(r).$$

This algorithm can be adapted according to the present invention by first rewriting (21) as:

$$T_n^{l+1}(r) \leftarrow T_n^l(r) - T_n^l(r) + \frac{1}{\alpha^l(r)}\sum_{j=1}^{m} \overline{P_n^l(r-r_p^j)} \cdot \psi_n(r-r_p^j, r_p^j). \quad (25)$$

Next, (25) can be rewritten as an iteration over the phase φ according to (6):

$$\varphi^{l+1}(r) \leftarrow \quad (26)$$

$$\varphi^l(r) - \varepsilon e^{-i\varphi^l(r)}\left(-T_n^l(r) + \frac{1}{\alpha^l(r)}\sum_{j=1}^{m} \overline{P_n^l(r-r_p^j)} \cdot \psi_n(r-r_p^j, r_p^j)\right),$$

with ε a parameter that is used to keep the changes in φ small so that (6) holds. The updated φ is subsequently used to form the updated T that is needed in the rest of the scheme, i.e. $T_n^l(r)=e^{i\varphi^l(r)}$.

The examples above are non-exhaustive. For more information on (unmodified) prior-art ptychographic reconstruction techniques, reference is made to the journal article by R. Hesse et al., *Proximal Heterogeneous Block Implicit-Explicit Method and Application to Blind Ptychographic Diffractive Imaging*, SIAM J. Imaging Sciences 8(1), 2015, pp. 426-457 [see the following link]:
https://www.researchgate.net/publication/
264624024_Proximal_Heterogeneous_Block_Implicit-Explicit_Method_and_Application_to_Blind_Ptychographic_Diffraction_Imaging It should be noted that, although charged-particle ptychography can be conveniently carried out in a CPM, one is not limited to use of a CPM in this context, and one can instead choose to construct/use a dedicated ptychography apparatus, if one so wishes.

Embodiment 1

FIG. 1 is a highly schematic depiction of an embodiment of a CPM M according to the current invention, which, in this case, is a (S)TEM (though, in the context of the current invention, it could just as validly be an ion-based or proton microscope, for example, or a SEM operating in transmissive mode (TSEM)). In FIG. 1, within a vacuum enclosure E, an electron source 4 (such as a Schottky emitter, for example) produces a beam (B) of electrons that traverse an electron-optical illuminator 6, serving to direct/focus them onto a chosen part of a specimen S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (in fact, the whole of item 6 is sometimes referred to as "a condenser system").

The specimen S is held on a specimen holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the specimen S to be irradiated/imaged/inspected by the electron beam traveling along axis B' (and/or allows scanning motion to be performed as an alternative to beam scanning [using deflector(s) D], and/or allows selected parts of the specimen S to be machined by a (non-depicted) focused ion beam, for example).

The (focused) electron beam B traveling along axis B' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of sensor 22, which might be a combined scintillator/photomultiplier or EDX (Energy-Dispersive X-Ray Spectroscopy) module, for instance; in such a case, an image could be constructed using basically the same principle as in a SEM. However, of principal importance in a (S)TEM, one can instead/supplementally study electrons that traverse (pass through) the specimen 5, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller 10 and displayed on a display device (not depicted), such as a flat panel display, for example. When not required, camera 30 can be retracted/withdrawn (as schematically indicated by arrows 30') so as to get it out of the way of axis B'.

STEM detector 32. An output from detector 32 can be recorded as a function of (X,Y) scanning position of the beam B on the specimen 5, and an image can be constructed that is a "map" of output from detector 32 as a function of X,Y. Typically, detector 32 will have a much higher acquisition rate (e.g. 106 points per second) than camera 30 (e.g. 102 images per second). In conventional tools, detector 32 can comprise a single pixel with a diameter of e.g. 20 mm, as opposed to the matrix of pixels characteristically present in camera 30. Once again, when not required, detector 32 can be retracted/withdrawn (as schematically indicated by arrows 32') so as to get it out of the way of axis B' (although such retraction would not be a necessity in the case of a donut-shaped annular dark field detector 32, for example; in such a detector, a central hole would allow beam passage when the detector was not in use).

As an alternative to imaging using camera 30 or detector 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller/computer processor 10 is connected to various illustrated components via control lines (buses) 10'. This controller 10 can provide a variety of functions, such as synchronizing actions, providing setpoints, processing signals, performing calculations, and displaying messages/information on a display device (not depicted). Needless to say, the (schematically depicted) controller 10 may be (partially) inside or outside the enclosure E, and may have a unitary or composite structure, as desired. The skilled artisan will understand that the interior of the enclosure E does not have to be kept at a strict vacuum; for example, in a so-called "Environmental (S)TEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, detector 32, spectroscopic apparatus 34, etc.

In the context of the current invention, the illuminator 6 may, for example, comprise a beam shaping element such as a lens and/or aperture plate/diaphragm, to appropriately shape (focus) the beam B into a relatively narrow "pencil" of charged particles, causing it to irradiate only a relatively small area (footprint) of the specimen S at any given time. Relative motion between the specimen S and the footprint of the beam B (so as to move the footprint onto another area of the specimen) can be produced by one or more of the following methods:

Using the positioning device A to move the specimen S relative to the beam B;

Using the deflector D to deflect the beam B relative to the specimen S;

Moving the source 4 or/and the abovementioned beam shaping element so as to displace the beam B relative to the specimen S.

For each such chosen position of the (footprint of the) beam B relative to the specimen S, one can (for example) use the TEM camera 30 [(position-dependent) intensity detector] to capture a diffractogram (diffraction pattern). Specifically, the controller 10 (or another processor device) can be configured/invoked to:

Acquire a ptychographic measurement set, by recording an output of (for example) TEM camera 30 for each of a series of different positions of the beam B upon the specimen S (achieved, for example, by sending an appropriate series of setpoints to items A, D, etc.).

Process the recorded outputs of said camera 30, and use them as input to perform a mathematical reconstruction algorithm according to the invention. The skilled artisan in the field of ptychography will understand that this step typically involves calculating (mean) intensity values of features in the recorded diffractograms: see, for example, the references cited above.

Display the results of said reconstruction algorithm, e.g. in the form of an image on a display device (not shown).

Embodiment 2

Figure 2A:
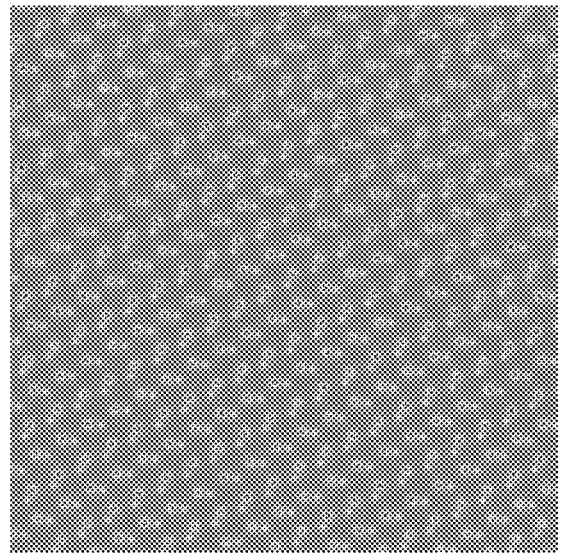
FIGS. 2A and 2B show ptychographic images obtained using a prior-art technique (FIG. 2A) and an embodiment of the present invention (FIG. 2B), for comparison purposes.
Figure 2B:
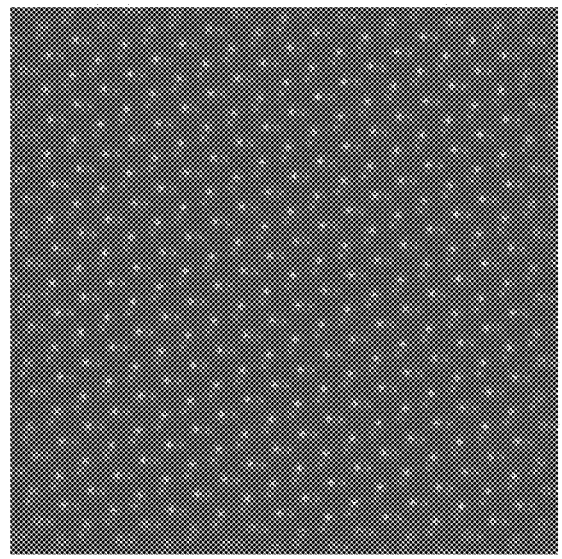

FIGS. 2A and 2B show ptychographic images obtained using a prior-art technique (FIG. 2A) and an embodiment of the present invention (FIG. 2B), for comparison purposes. Both images show a GaN crystalline lattice, imaged in a TEM with the following settings/parameters:

Specimen thickness: 5 nm.
Input (primary/probing) beam energy: 300 kV.
Field of view: 5 nm.
Defocus: 70 nm from disc of least confusion.

FIG. 2A shows the results of a standard Rodenburg reconstruction algorithm. Note the artifacts caused by phase wrapping, which cause the relatively heavy Ga atoms (atomic number Z=31) to appear as contorted, irregular, dark "loops" surrounded by bright halos. In contrast, FIG. 2B shows the results of a direct phase-reconstructing algorithm according to the present invention. Note in this case that the Ga atoms take the form of uniform dots.

In view of the many possible embodiments to which the principles of the disclosed technology may be applied, it should be recognized that the illustrated embodiments are only preferred examples of the disclosed technology and should not be taken as limiting the scope of protection. Rather, the scope of protection is defined by the following claims. We therefore claim all that comes within the scope of these claims.

The invention claimed is:

1. A method of imaging a specimen using ptychography, comprising:
    directing a charged-particle beam from a source through an illuminator so as to traverse the specimen and land upon a detector,
    detecting a flux of radiation emanating from the specimen with the detector,
    calculating at least one property of a charged-particle wavefront exiting the specimen based on using an output of the detector in combination with applying a mathematical reconstruction technique, wherein the-at least one property comprises a phase of the wavefront, and wherein applying the mathematical construction technique comprises directly reconstructing the phase of the wavefront to determine a reconstructed phase of the wavefront.

2. A method according to claim 1, wherein the reconstructed phase of the wavefront is a continuous function.

3. A method according to claim 1, wherein the mathematical reconstruction technique comprises the following iterative scheme:

$$\varphi_{n+1}(r)=\varphi_n(r)-ie^{-i\varphi_n(r)}\alpha_n\Delta_n(r)$$

Wherein:

$\varphi_n(r)$ represents an estimate for phase $\varphi(r)$ at iteration index n and position r, Subscripts n and n+1 denote iteration indices, Parameter $\alpha_n$ controls the (rate of) convergence of the scheme, and $\Delta_n(r)$ is a correction term.

4. A method according to any of claim 1, wherein the iterative scheme is based on one or more of a Rodenburg approach, a proximal heterogeneous block implicit-explicit (PHeBIE) approach, and a Thibault approach.

5. A method according to claim 1, wherein the reconstructed phase is used to compile an image of the specimen without phase unwrapping.

6. A method according to claim 1, wherein the reconstructed phase is subjected to a low-pass filtering operation.

7. A method according to claim 1, wherein the mathematical reconstruction technique does not involve indirectly deriving the phase from a reconstructed function of amplitude and phase.

8. A method according to claim 3, wherein the iterative scheme is based on one or more of a Rodenburg approach, a proximal heterogeneous block implicit-explicit (PHeBIE) approach, and a Thibault approach.

9. A method according to claim 3, wherein the reconstructed phase is used to compile an image of the specimen without phase unwrapping.

10. A method according to claim 3, wherein the mathematical reconstruction technique does not involve indirectly deriving the phase from a reconstructed function of amplitude and phase.

11. An apparatus for imaging a specimen using ptychography, comprising:

a specimen holder for holding the specimen;

a source for producing a beam of charged particles;

an illuminator for directing the beam so as to irradiate the specimen;

a detector for detecting a flux of radiation emanating from the specimen in response to irradiation;

a controller programmed to analyze output from the detector and use the output in a mathematical reconstruction technique to calculate at least one property of a wavefront exiting the specimen, wherein the at least one property of the wavefront comprises a phase of the wavefront, and wherein the reconstruction technique directly reconstructs the phase.

12. The apparatus of claim 11, wherein the mathematical reconstruction technique does not involve indirectly deriving the phase from a reconstructed function of amplitude and phase.

13. The apparatus of claim 11, wherein the mathematical reconstruction technique comprises the following iterative scheme:

$$\varphi_{n+1}(r)=\varphi_n(r)-ie^{-i\varphi_n(r)}\alpha_n\Delta_n(r)$$

Wherein:

$\varphi_n(r)$ represents an estimate for phase $\varphi(r)$ at iteration index n and position r, Subscripts n and n+1 denote iteration indices, Parameter $\alpha_n$ controls the (rate of) convergence of the scheme, and $\Delta_n(r)$ is a correction term.

14. The apparatus of claim 13, wherein the iterative scheme is based on one or more of a Rodenburg approach, a proximal heterogeneous block implicit-explicit (PHeBIE) approach, and a Thibault approach.

15. The apparatus of claim 11, wherein the apparatus comprises a charged particle microscope.

16. A non-transitory computer-readable storage medium storing a computer program product, the computer program product including instructions, the instructions when executed instructing one or more processors to perform a method, the method comprising:

calculating at least one property of a charged-particle wavefront exiting a specimen following irradiation with a charged particle beam based on using an output of a detector for a flux of radiation emanating from the specimen in combination with applying a mathematical reconstruction technique, wherein the at least one property comprises a phase of the wavefront, and wherein applying the mathematical construction technique comprises directly reconstructing the phase of the wavefront to determine a reconstructed phase of the wavefront.

17. The non-transitory computer-readable storage medium of claim 16, wherein the mathematical reconstruction technique comprises the following iterative scheme:

$$\varphi_{n+1}(r)=\varphi_n(r)-ie^{-\varphi_n(r)}\alpha_n\Delta_n(r)$$

Wherein:

$\varphi_n(r)$ represents an estimate for phase $\varphi(r)$ at iteration index n and position r, Subscripts n and n+1 denote iteration indices, Parameter $\alpha_n$ controls the (rate of) convergence of the scheme, and $\Delta_n(r)$ is a correction term.

18. The non-transitory computer-readable storage medium of claim 17, wherein the iterative scheme is based on one or more of a Rodenburg approach, a proximal heterogeneous block implicit-explicit (PHeBIE) approach, and a Thibault approach.

19. The non-transitory computer-readable storage medium of claim 16, wherein the reconstructed phase is used to compile an image of the specimen without phase unwrapping.

20. The non-transitory computer-readable storage medium of claim 16, wherein the mathematical reconstruction technique does not involve indirectly deriving the phase from a reconstructed function of amplitude and phase.

* * * * *